United States Patent
Gavrila et al.

(10) Patent No.: US 6,993,467 B2
(45) Date of Patent: Jan. 31, 2006

(54) METHOD AND CIRCUITS FOR PERFORMING OFFLINE CIRCUIT TRIMMING

(75) Inventors: Gabe C. Gavrila, Colorado Springs, CO (US); Troy J. Littlefield, Colorado Springs, CO (US); Fernando Ramon Martin-Lopez, Colorado Springs, CO (US)

(73) Assignee: Toko, Inc., (JP)

( * ) Notice: Subject to any disclaimer, the term of this patent is extended or adjusted under 35 U.S.C. 154(b) by 1143 days.

(21) Appl. No.: 09/731,096

(22) Filed: Dec. 5, 2000

(65) Prior Publication Data

US 2002/0069394 A1   Jun. 6, 2002

(51) Int. Cl.
  *G06F 17/50* (2006.01)
(52) U.S. Cl. .......................... 703/14; 703/16
(58) Field of Classification Search ............... 703/14, 703/16

See application file for complete search history.

(56) References Cited

U.S. PATENT DOCUMENTS

| | | | |
|---|---|---|---|
| 4,814,640 A | 3/1989 | Miyake | 307/303 |
| 5,446,407 A | 8/1995 | Yamamoto | 327/525 |
| 5,793,674 A | 8/1998 | Kubo et al. | 365/185.09 |
| 5,991,219 A | 11/1999 | Nakashima | 365/225.7 |
| 5,995,413 A * | 11/1999 | Holzmann et al. | 365/185.09 |
| 6,011,425 A | 1/2000 | Oh et al. | 327/525 |
| 6,338,032 B1 * | 1/2002 | Chen | 703/16 |
| 6,472,897 B1 * | 10/2002 | Shyr et al. | 324/765 |

* cited by examiner

*Primary Examiner*—Leo Picard
*Assistant Examiner*—Carlos Ortiz-Rodriguez
(74) *Attorney, Agent, or Firm*—William E. Hein

(57) ABSTRACT

An offline trim circuit includes one or more irreversible trim elements, such as fuses, for example, used for setting electrical parameters to desired values. Associated circuitry is employed to verify the effect of trimming, prior to permanently setting trim bit values, permitting the optimal definition of the trim bit sequence and completely eliminating guesswork from the trimming procedure.

21 Claims, 4 Drawing Sheets

METHOD AND CIRCUITS FOR PERFORMING OFFLINE CIRCUIT TRIMMING

BACKGROUND AND SUMMARY OF THE INVENTION

This invention relates generally to integrated circuit fabrication and, more particularly, to a method for trimming components of an integrated circuit following its fabrication. The invention refers, as well, to hybrid circuits, assembled board circuits and any other type of electrical circuits that use trimming to adjust performance parameters of the circuit.

Integrated circuit fabrication processes yield circuit devices whose electrical performance is characterized by parameters having a certain range of acceptable values. When the range of fabrication process parameters for these devices results in circuits having functional parameters whose ranges are wider than the specifications allow, it becomes necessary to trim or adjust elements within the integrated circuit, to ensure that the functional parameters for the circuit will meet the specification requirements. Similarly, the components and/or modules included in a circuit may display a range of parameters that may not be tight enough, to meet the overall circuit performance target. This can happen whether or not individual components and/or modules meet their individual specs.

Several circuits and methods are known in the prior art for trimming integrated circuits, exemplary of which are U.S. Pat. No. 4,814,640 to Miyake, U.S. Pat. No. 5,446,407 to Yamamoto, U.S. Pat. No. 5,793,674 to Kubo et al., U.S. Pat. No. 5,991,219 to Nakashima, and U.S. Pat. No. 6,011,425 to Oh et al. The prior art typically involves the use of a non-volatile memory cell, Zener diode zapping, or polysilicon or metal fuse cutting. A common requirement of all of these prior art approaches is that the trimming must be performed on an Automated Test Equipment (ATE) machine. First, the circuit is tested and its parameters are evaluated. If a particular parameter falls outside of its specified range, a first trim bit is adjusted. The parameter is again evaluated on the ATE machine and, if needed, a new trim step is performed, by adjusting another trim bit. This cycle is repeated until the parameter falls within the specified range or until the trim capability is exhausted.

All of the known trim procedures are subject to two major drawbacks. First, trim programming is based on a best guess approach, which is the only option available for the first and all subsequent trimming steps, for each parameter. There is no way of determining circuit performance, following a trim step, without actually performing that trim step. Second, since the entire trim procedure requires the use of an ATE machine, the cost of each integrated circuit is significantly increased, due to the additional ATE test time involved in the trimming procedure. As test cost surpasses actual die cost in many cases, trimming becomes a very important factor in determining the economic viability of an integrated circuit.

In accordance with the preferred embodiments of the present invention, offline trim elements and associated circuitry are provided to minimize the use of an ATE machine during circuit trimming and to thereby reduce production costs significantly. As used herein, the term trim elements refers to fuses, other components and/or subcircuits with substantially similar behavior, Zener diodes, or memory cell based circuits, all of which may be employed to send trim bit high or low voltage signals to circuits requiring trimming. The associated circuitry includes a shift register for converting serially input data into parallel format data, that is afterwards sent to each trim bit. This circuit also serves to temporarily inhibit the effect of the trim elements and sends an arbitrary, externally controlled, digital input signal, to the trim points in the circuit to be trimmed. This circuit includes provisions for permanently disabling itself, following completion of the trimming procedure. When the associated circuitry is disabled, the trim signal is sent to the various trimming points in the circuit to be trimmed, based exclusively on the status of the trim elements themselves.

DETAILED DESCRIPTION OF THE PREFERRED EMBODIMENTS

Figure 1:
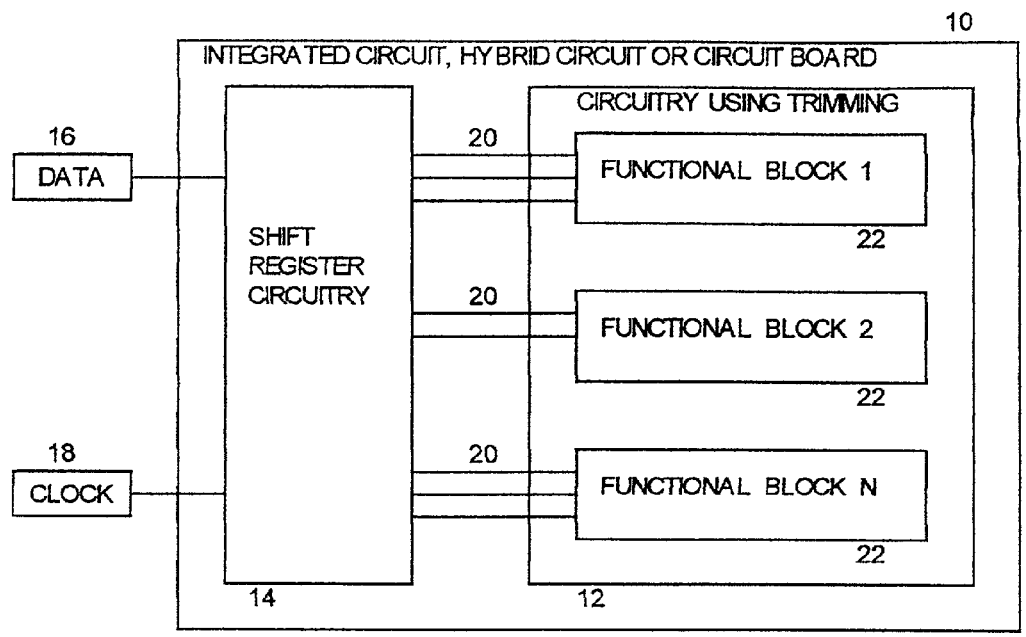
FIG. 1 is a block diagram of circuitry generally illustrating the offline trim technique of the present invention.

FIG. 1 shows a general block diagram, comprising an integrated circuit, hybrid circuit or trimmable card 10, containing circuitry 12 using trimming. A shift register circuit 14 allows the serial input of data 16 describing trim bit values. However, input of data 16 may be, just as well, parallel and/or mixed (serial and/or parallel). Since it is usually more convenient to use a single input port or pad for data entry, shift register circuit 14 is employed to accomplish serial to parallel conversion of data 16, by shifting it serially from one bit to the next. This happens at alternate clock cycles in most cases in which a bistable circuit is employed to construct shift register circuit 14. Thus, a trim bit word can be sent to the circuit 10, and its effect on circuit performance and/or circuit parameters can be evaluated. A clock signal 18 is employed by the shift register circuit 14.

Shift register circuit 14 also facilitates the use of trim in two distinct modes of operation, hereinafter referred to as the online mode and the offline mode.

The online mode of operation is characterized by the fact that the trim bit signals, typically high or low voltages that are near the upper rail voltage and ground, respectively, are determined exclusively by the data 16. That is, the trim bit combination in effect, is the one sent to the circuit 10 from outside. Consequently, this trim bit combination can be changed at will, experimented with, and evaluated as to its effect on the trim circuit. In the diagram of FIG. 1, trim bit lines are represented by the lines 20, in various numbers, between the shift register circuit 14 and a plurality of functional circuit blocks 22 to be trimmed. A very important consequence is that all available trim combinations can be evaluated in a fully determinative fashion, without the need for guesswork. Thus the present method can always identify the optimum trim bit sequence available for each individual die, circuit or card, independent from process and/or component variations. It also facilitates a determination of the optimum trim bit sequence for whatever hardware is implemented, taking full advantage of the embedded structure and obtaining maximum performance available from that hardware. This online mode of operation usually employs an ATE machine to vary the trim bit sequence, apply it to the device under test (DUT) and evaluate its impact on the parameter that is targeted for trimming. Because all of these measurements are electrical, they can be performed quickly, so little time is consumed for this purpose. Since ATE machine test time cost often exceeds the actual die cost, minimizing the test time is very important for many circuits. The same consideration applies to hybrid circuits, assembled boards, etc. Another important consideration, regardless of the type of test equipment used in the procedure (ATE, manual, etc.), is the fact that all of these measurements and evaluations are performed without physically altering any of the trim elements; these measurements can be performed multiple times, as they preserve the circuit "virgin" state, all its trim elements being left intact (not programmed). The data collected during this online phase of the trim procedure, such as die location (in the case of integrated circuits) and optimum trim bit sequence, as determined for each circuit, is stored in a data base, as it is commonly done in the vast majority of situations involving the use of an ATE machine. In the case of integrated circuits, the database is often called a wafer map.

The offline mode of operation is characterized by the fact that trim bit signals are determined exclusively by the status of the permanent (or irreversible) trim elements, such as fuses, diodes, non-volatile memory cells, etc., included within the shift register circuit 14. In the offline mode operation, the shift register section of the circuit 14 and all related circuitry have no effect on trim bit values. Trim bit values are determined exclusively by the status of the trim elements themselves. The actual trimming, performed by adjusting the trim elements for each circuit or die, in accordance with the optimum trim bit sequence determined in the online mode of operation, takes place offline—since there is nothing to be measured in the actual trimming phase, costly use of an ATE machine is not required for this phase of the trimming procedure. The appropriate trim bit sequence is associated with each circuit and/or die, using the database (wafer map in the case of integrated circuits) generated during the online mode of operation described above. Performing the trimming offline is particularly important from a cost standpoint, as this is a relatively slow procedure, due to the need for mechanical and/or optical tool positioning.

Shift register circuit 14 includes provisions to allow the permanent disabling of the online mode of operation and the permanent enabling of the offline mode of operation, which occurs after the optimum trim bit sequence has been determined.

Figure 2:
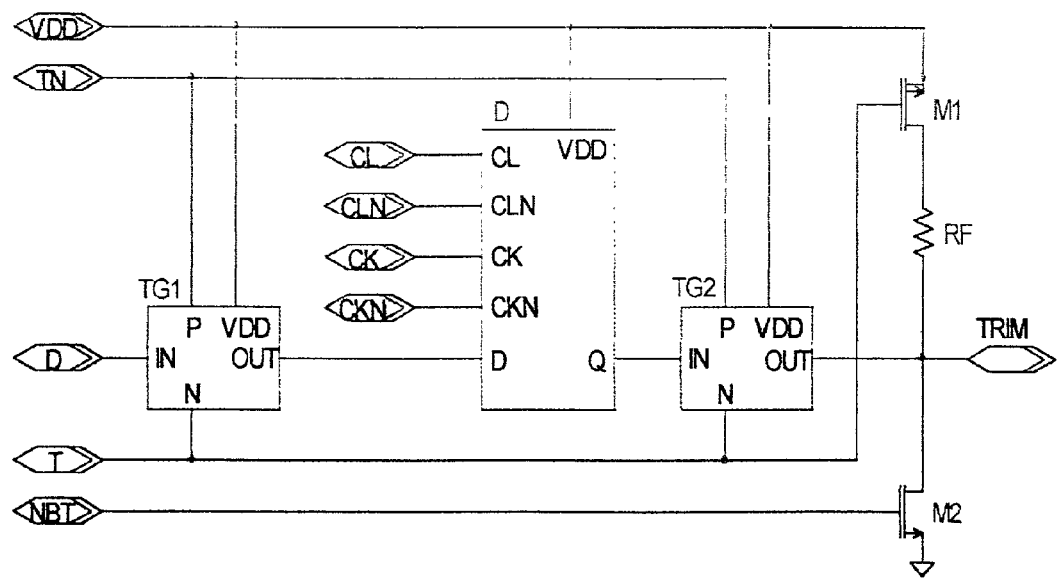
FIG. 2 is a general schematic diagram of a single fuse, trim bit subcircuit, in accordance with one embodiment of the present invention.

Referring now to the circuit diagram of FIG. 2, device M2 acts as a controlled current source such that when a signal NBT is present (on), device M2 is a current mirror, and when signal NBT is not present (off), device M2 is also off A device M1 acts as a simple switch, controlled by a signal T, such that when signal T is low, device M1 is on, and when signal T is high, device M1 is off.

The circuit of FIG. 2 has two modes of operation, in the first of which both devices M1 and M2 are off. In this mode of operation, called online, the upper terminal of a fuse RF is open, so that it has no impact on the voltage present at a TRIM node. Since device M2 is off, it does not affect the voltage at the TRIM node. At the same time, signals T and its complement, TN, serve to turn on a pair of transmission gates TG1 and TG2. As a result, the voltage at the TRIM node is determined exclusively by the output Q of a D-latch flip-flop D.

In the second mode of operation of the circuit of FIG. 2, called offline, both devices M1 and M2 are on. In this mode, signals T and TN turn off transmission gates TG1 and TG2, thus preventing the D-latch flip-flop D from having any effect on the voltage at the TRIM node. Signal T turns on device M1, thereby connecting the upper terminal of the fuse RF to the power supply rail VDD. At the same time, signal NBT causes device M2 to act as a current mirror. Consequently, in the offline mode of operation, the voltage at the TRIM node is determined by the status of the fuse RF, which is connected between the power supply VDD and the TRIM node. If fuse RF is intact, the voltage at the TRIM node is high, because the voltage drop across switch M1 and the voltage drop generated by the current in device M2, across the fuse RF, are both very small. If fuse RF is cut (blown), device M2 goes into saturation, and the voltage at the TRIM node becomes low.

Figure 3:
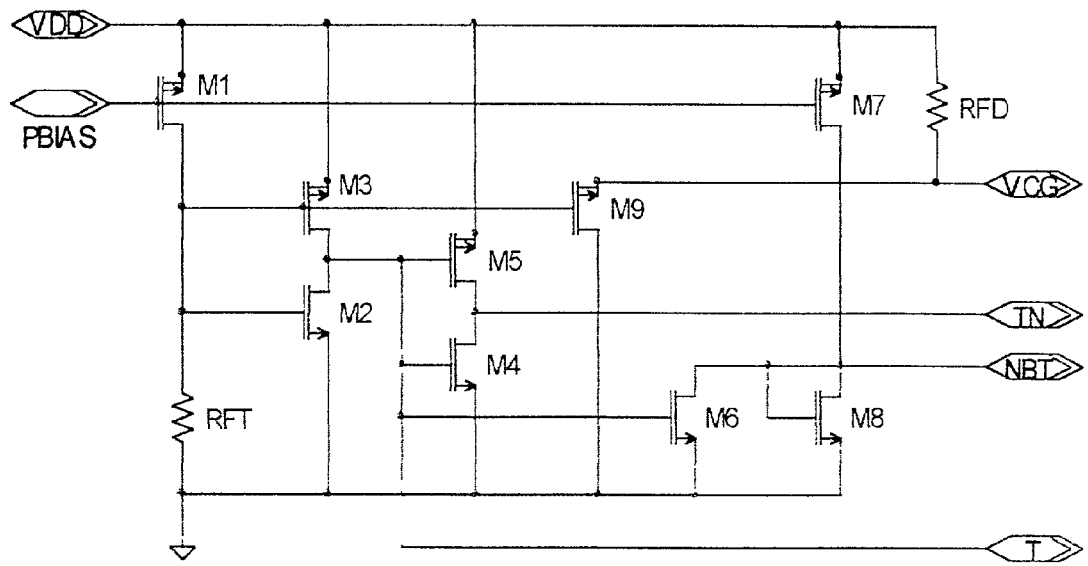
FIG. 3 is a detailed schematic diagram of a trim control circuit, employed with the single fuse, trim bit subcircuit of FIG. 2.

FIG. 3 shows an example of a trim control circuit that may be employed with the single fuse trim circuit of FIG. 2. The trim control circuit takes care of the bias, power supply and various other signals sent to the shift register circuitry 14 of FIG. 1. In the online mode of operation (the first mode of operation described above), fuses RFT and RFD are both intact. Device M1 operates as a current mirror, signal T is high and signal TN is low. At the same time, signal NBT is low. Signals T and TN control transmission gates TG1 and TG2 of FIG. 2. Signal T also controls device M1 of FIG. 2, while signal NBT controls device M2 of FIG. 2.

After the trimming process is completed, fuses RFT and RFD are cut. When fuse RFT is cut, device M1 goes into saturation, and an inverter, comprising devices M2 and M3, forces signal T low. Another inverter, comprising devices M4 and M5, forces signal TN high. This turns off transmission gates TG1 and TG2 of FIG. 2. With signal T low, device M6 of FIG. 3 turns off, allowing signal NBT to rise to a voltage dictated by a device M8 acting as a current reference, thereby turning on device M2 of FIG. 2. The voltage to which signal NBT rises, is determined by the current injected by a device M7 into a diode connected device M8. Fuse RFD is cut in order to remove a bias voltage VCG from a clock generator module. This action is supplementary to turning off the transmission gates TG1 and TG2. In addition, clock generator power supply line VCG of FIG. 3 is grounded by a device M9.

Figure 4:
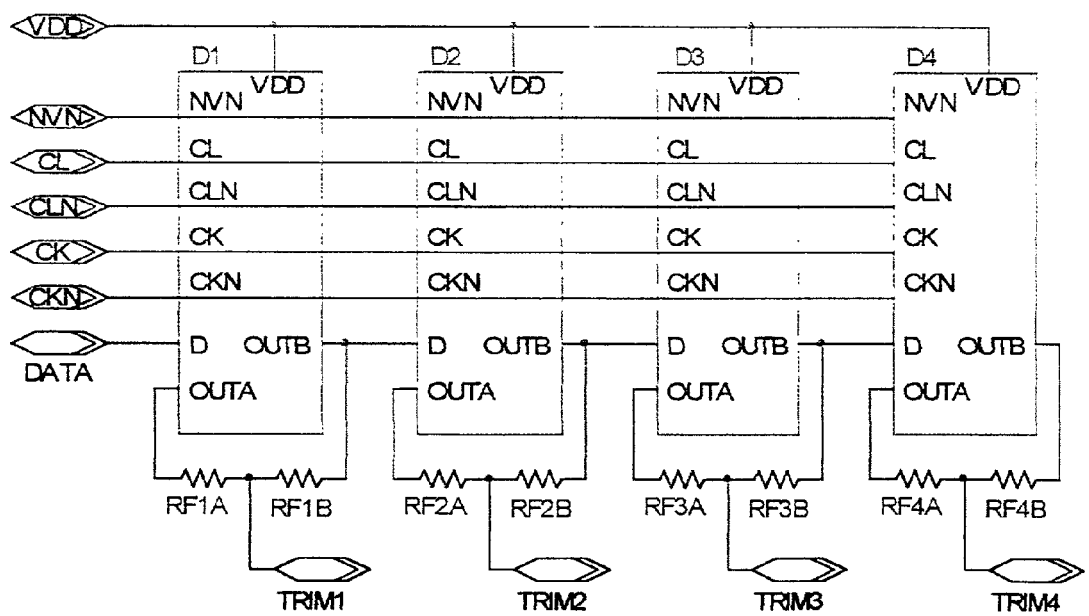
FIG. 4 is a generic schematic diagram of a double fuse set circuit, in accordance with another embodiment of the present invention.

Referring now to FIG. 4, there is shown an example of a circuit that employs two fuses, RFxA and RFxB, around the D-latch flip-flop associated with each trim bit. The advantage of the circuit of FIG. 4 is that it consumes no current after trimming is performed. This is unlike the circuit of FIG. 2, which will continue to consume current after trimming is completed, for the case in which the fuse RF is not cut, due to the current flow in device M2, as the result of the trim bit being set to high. On the other hand, the disadvantage of the circuit of FIG. 4 is the need to employ two fuses for each trim bit and the need to always trim a fuse, regardless of whether the final state of the trim bit is high or low.

Figure 5:
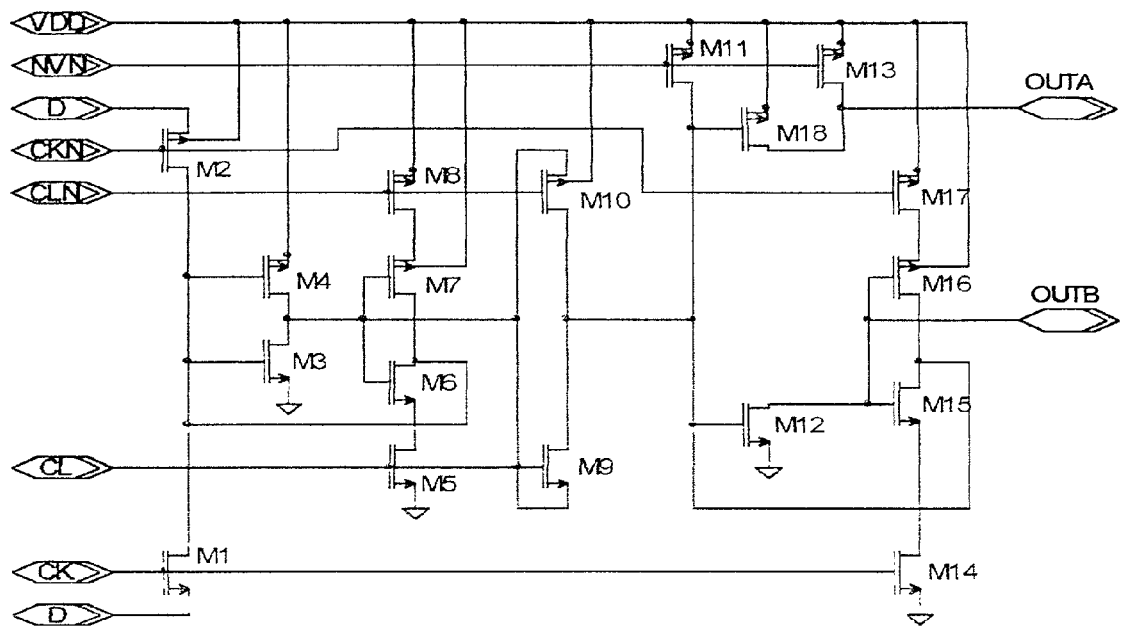
FIG. 5 is a detailed schematic diagram of a D-latch flip-flop circuit that may be used to implement the circuit of FIG. 4, employing two non-overlapping clock signals.

FIG. 5 shows an example of a detailed schematic diagram of a D-latch flip-flop circuit, using two non-overlapping clock signals, that may be employed to implement each of the D-latch flip-flop blocks, D1–D4, of FIG. 4. The two non-overlapping clock signals are labeled CL and CK in FIGS. 4–6. Their complements are CLN and CKN, respectively. Terminals OUTA and OUTB for the circuit of FIG. 5 are connected to the set of fuses RFxA and RFxB of FIG. 4.

The online mode of operation of the circuit of FIG. 5 is determined by a signal NVN being high. Signal NVN is the complement of a non-volatile signal NV. Signal NVN going high turns off a pair of devices M11 and M13. In this mode, the output voltage at terminals OUTA and OUTB (FIG. 4 and FIG. 5) is determined exclusively by the state of the D-latch flip-flop of FIG. 5.

The offline mode of operation of the circuit of FIG. 5 is entered when the NVN signal goes low. In this mode of operation, devices M11 and M13 are both on, and device M18 is off, thereby causing nearly the full power supply voltage VDD to appear at output terminal OUTA. In this mode of operation, device M12 is also turned on, thereby causing the voltage at output terminal OUTB to be near ground voltage. This offline mode of operation of the circuit of FIG. 5 is in effect after trimming is completed, so the trim bit status for each bit is determined exclusively by which of the two fuses—RFxA or RFxB—is cut.

Figure 6:
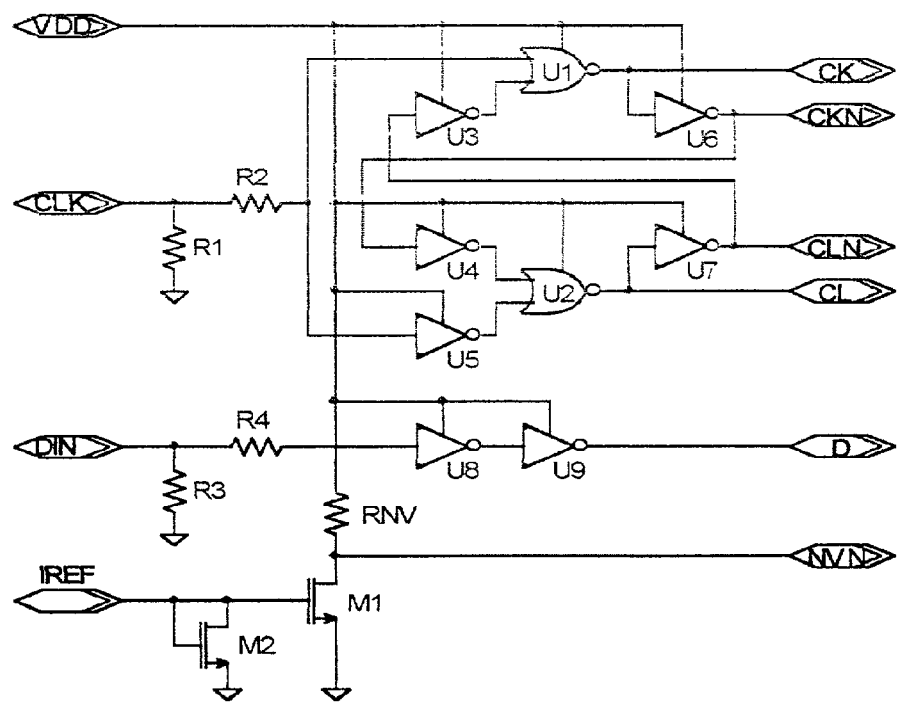
FIG. 6 is a detailed schematic diagram of a circuit that may be employed for generating the two non-overlapping clock signals for application to the circuits of FIGS. 4 and 5.

Referring now to FIG. 6, there is shown a detailed schematic diagram of a circuit that may be employed for generating, from an input clock signal CLK, the two non-overlapping clock signals CL and CK, as well as their complements, CLN and CKN, that are required for the operation of the D-latch flip-flop circuit shown in FIG. 5 The circuit of FIG. 6 also serves to generate the signal NVN that is applied to the D-latch flip-flop circuit shown in FIG. 5. After all of the trim bits are set to their desired values, a fuse RNV of FIG. 6 is cut, thus forcing signal NVN low, due to the saturation of a device M1 of FIG. 6, which cannot sink a mirrored current, determined by the current reference represented by a device M2.

Figure 7A:
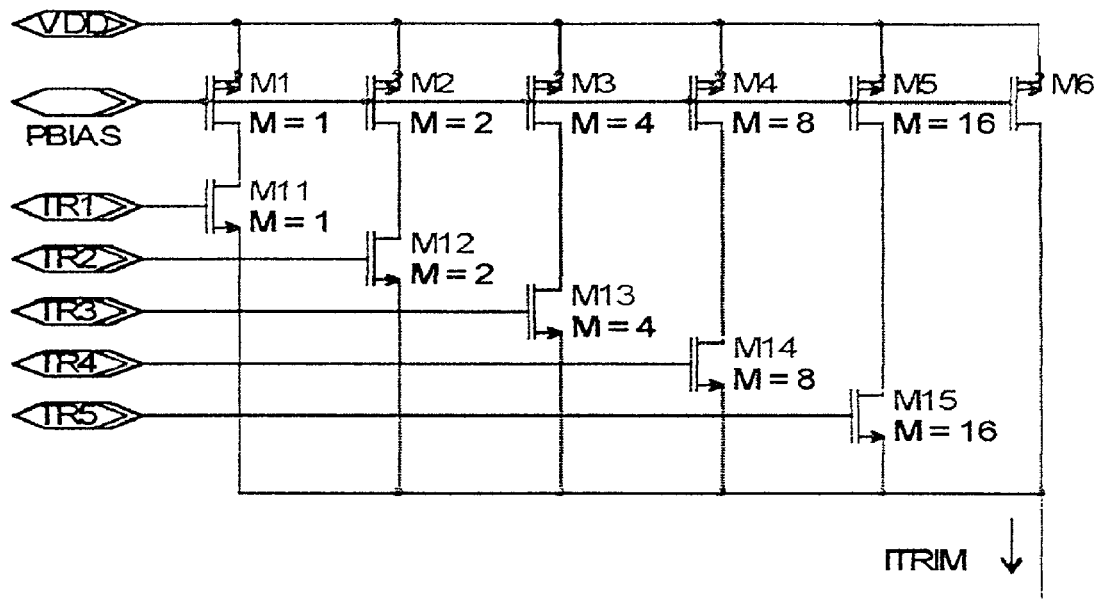
FIGS. 7A and 7B are examples of trimming applications in electrical circuits.

FIG. 7A shows an example of a circuit that uses trimming to adjust a parameter—in this case, the amount of current injected into the bottom node (wire) of the schematic. This current is marked ITRIM in the schematic. The circuit in FIG. 7A can be a part of or one of the functional blocks 22 of FIG. 1. Five trim bit signals, TR1 through TR5 in FIG. 7A, are applied to a series of five devices, M11 through M15, acting as switches. Devices in the top row, M1 through M5, are five current mirrors, with weighed current mirror ratios. When the gate node common to the current mirrors, M1 through M5, is properly biased by a current reference device, for instance, the current mirrors inject current in the bottom node (wire) of the schematic diagram, depending on the status of the switch devices M11 through M15. For example, if TR3 voltage is high, then switch M13 is off, hence, the current source in series with it, M3, will not inject any current in the bottom node (wire) of the schematic. Various combinations of open and closed switches allow control of the amount of current injected—by current sources M1 through M5—into the bottom node (wire) of the schematic shown in FIG. 7A, thus trimming the value of the ITRIM current. Trim bit values TR1 through TR5 control M11 through M15 switches status, in FIG. 7A.

Figure 7B:
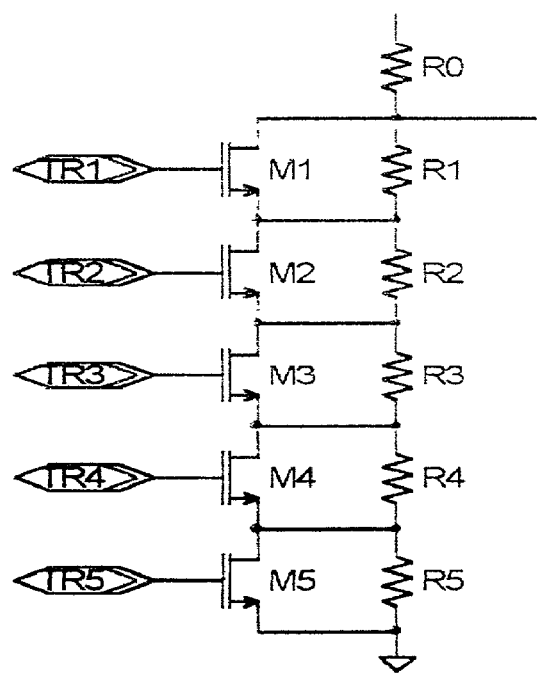

FIG. 7B shows an example of using trimming to adjust component values in a circuit. FIG. 7B shows a section of a voltage divider resistor string. The circuit in FIG. 7B can be a part of one of the functional blocks 22 of FIG. 1. Switches M1 through M5 are controlled by trim bit signals TR1 through TR5. A high trim bit value will turn on its corresponding switch. When a switch is on, it will shunt the resistor encompassed by its drain and source terminals. The Rdson of the switch is much less than the resistance of the resistor it shunts, so, from a practical standpoint, that segment is shorted out of the string of resistors. While the Rdson of the switch can be taken into account, it can be approximated with an ideal short circuit if its value is much smaller than the least significant "bit" adjustment that the resistor string provides. The least significant bit adjustment is the smallest of all resistor segments, with shunt switches across, which are part of the resistive voltage divider (including R1, R2, R3 R4, R5), even if not represented in FIG. 7B.

We claim:

1. A method for triming a circuit device containing trim elements, the method comprising:
    applying, in an online mode of operation, one or more trim bit sequences to the circuit device;
    evaluating, in said online mode of operation, the effect on the circuit device resulting from each of the trim bit sequences applied thereto, without physically altering any of said trim elements;
    determining, in said online mode of operation, one or more optimum trim bit sequences required to achieve a desired test result; and
    permanently adjusting, in an offline mode of operation, one or more trim elements of the circuit device in accordance with the determined one or more optimum trim bit sequences;
    said circuit device being connected to an external electrical measurement apparatus during said online mode of operation and being disconnected from said external electrical measurement apparatus during said offline mode of operation.

2. A method as in claim 1, further comprising the step of generating and storing a data base representative of said one or more optimum trim bit sequences.

3. A method as in claim 1, further comprising the step of generating and storing a data base of information obtained in said online mode of operation.

4. A method as in claim 2, further comprising the step of generating and storing a data base of information obtained in said online mode of operation.

5. A method as in claim 2, wherein said data base comprises a wafer map.

6. A method as in claim 3, wherein said data base comprises a wafer map.

7. A method as in claim 4, wherein said data base comprises a wafer map.

8. A method as in claim 1, wherein, after the completion of trim bit sequences evaluation, said online mode of operation is permanently disabled and said offline mode of operation is permanently enabled.

9. A trimming circuit for use in trimming a circuit device containing trim elements, the trimming circuit comprising:
    one or more trim elements;
    one or more trim bit subcircuits, each of said trim bit subcircuits being associated with one or more trim elements; and
    associated circuitry operative in online and offline modes of operation of said trimming circuit, said associated circuitry being further operative during said online mode of operation, for permitting the external application of trim bit sequences to said circuit device.

10. A trimming circuit as in claim 9, wherein said associated circuitry comprises a shift register for enabling external input or programming of said trim bit sequences.

11. A trimming circuit as in claim 10, wherein said shift register comprises one or more trim bit subcircuits.

12. A trimming circuit as in claim 11, wherein each one of said trim bit subcircuits is associated with a particular trim bit; and each one of said trim bit subcircuits is associated with one or more trim elements.

13. A trimming circuit as in claim 12, wherein each of said one or more trim bit subcircults comprises a bistable flip-flop.

14. A trimming circuit as in claim 12, wherein said one or more trim elements comprise one or more fuses.

15. A trimming circuit as in claim 14, wherein said one or more fuses comprise one or more polysilicon fuses.

16. A trimming circuit as in claim 14, wherein said one or more fuses comprise one or more metal fuses.

17. A trimming circuit as in claim 12, wherein said one or more trim elements comprise one or more Zener diodes.

18. A trimming circuit as in claim 12, wherein said one or more trim elements comprise one or more memory circuits.

19. A trimming circuit as in claim 9, wherein each of said one or more trim bit subcircuits comprises:

a current source connected to a selected one of upper and lower power supply rails;

a switch connected to a remaining one of said upper and lower power supply rails; and a fuse connected between said current source and said switch.

20. A trimming circuit as in claim 13, wherein each of said one or more trim bit subcircuits comprises two fuses, connected in series and to the one of said bistable flipflop circuits associated with that trim element.

21. A trimming circuit as in claim 9, wherein one or more of said trim elements are operative for permanently disabling said online mode of operation of said trimming circuit and for permanently enabling said offline mode of operation of said trimming circuit.

* * * * *